US 9,589,817 B2

(12) United States Patent
Melgaard et al.

(10) Patent No.: US 9,589,817 B2
(45) Date of Patent: Mar. 7, 2017

(54) DRYER

(75) Inventors: Hans L. Melgaard, North Oaks, MN (US); Daniel M. Ruf, Edina, MN (US); Richard L. Steblay, Eden Prairie, MN (US)

(73) Assignee: Illinois Tool Works Inc., Glenview, IL (US)

( * ) Notice: Subject to any disclaimer, the term of this patent is extended or adjusted under 35 U.S.C. 154(b) by 1341 days.

(21) Appl. No.: 13/439,367

(22) Filed: Apr. 4, 2012

(65) Prior Publication Data

US 2012/0260518 A1    Oct. 18, 2012

Related U.S. Application Data

(60) Provisional application No. 61/475,821, filed on Apr. 15, 2011.

(51) Int. Cl.
*F26B 3/00*     (2006.01)
*H01L 21/67*    (2006.01)
(Continued)

(52) U.S. Cl.
CPC .......... *H01L 21/67034* (2013.01); *F26B 3/30* (2013.01); *F26B 15/18* (2013.01); *F26B 21/004* (2013.01); *F26B 21/06* (2013.01)

(58) Field of Classification Search
CPC .... F26B 25/14; F26B 3/00; F26B 5/04; F26B 21/10; F26B 21/004; F26B 3/02; B01D 2257/708
(Continued)

(56) References Cited

U.S. PATENT DOCUMENTS 3,415,503 A     12/1968 Beck
3,727,324 A *   4/1973 Melgaard ................... 34/216
(Continued)

FOREIGN PATENT DOCUMENTS

CN     201706866     1/2011
CN     201740352     2/2011
(Continued)

OTHER PUBLICATIONS

European Patent Office, "Office Action from EP Application No. 12721027.6 mailed Oct. 9, 2014", "from Foreign Counterpart of U.S. Appl. No. 13/439,367", Sep. 10, 2014, pp. 16, Published in: EP.
(Continued)

*Primary Examiner* — Kenneth Rinehart
*Assistant Examiner* — John McCormack
(74) *Attorney, Agent, or Firm* — McAndrews, Held & Malloy, Ltd.

(57) ABSTRACT

A dryer comprising an enclosure and a transporter for transporting one or more components therethrough between a first and a second opening. The dryer includes one or more heating elements and a first and a second duct within the enclosure. The first and said second duct each include a plurality of openings configured for discharging heated air towards the one or more components. An exhaust stack in fluid communication with an interior of the enclosure includes an exhaust blower for extracting fluid from within the enclosure, and one or more heating elements for oxidizing the vaporized compounds. The supply and the exhaust blowers cooperatively operate to induce infiltration of air through the first and the second opening. A method for operating the dryer is also provided.

20 Claims, 7 Drawing Sheets

(51) Int. Cl.
*F26B 3/30* (2006.01)
*F26B 15/18* (2006.01)
*F26B 21/00* (2006.01)
*F26B 21/06* (2006.01)

(58) Field of Classification Search
USPC ......... 34/412, 232, 549, 526, 443, 638, 639, 34/651–656, 90, 611, 624, 487, 510
See application file for complete search history.

(56) References Cited

U.S. PATENT DOCUMENTS

| | | | |
|---|---|---|---|
| 3,729,832 A * | 5/1973 | Lund | F25B 31/00 34/105 |
| 4,307,681 A | 12/1981 | Lampkin et al. | |
| 4,338,078 A | 7/1982 | Lampkin | |
| 4,389,970 A | 6/1983 | Edgerton | |
| 4,477,718 A | 10/1984 | Crain et al. | |
| 4,517,448 A | 5/1985 | Crain et al. | |
| 4,756,091 A | 7/1988 | Denend | |
| 4,899,461 A * | 2/1990 | Lehtinen | 34/392 |
| 5,263,265 A | 11/1993 | Melgaard | |
| 5,433,368 A | 7/1995 | Spigarelli | |
| 5,440,101 A * | 8/1995 | Cox | B23K 1/008 219/388 |
| 5,667,378 A * | 9/1997 | Bushman | B28B 11/243 432/137 |
| 5,814,789 A | 9/1998 | O'Leary et al. | |
| 5,993,500 A | 11/1999 | Bailey et al. | |
| 6,018,144 A | 1/2000 | Vogt et al. | |
| 6,067,726 A | 5/2000 | Rogne et al. | |
| 6,156,657 A | 12/2000 | Kuwabara et al. | |
| 6,162,296 A | 12/2000 | Kohara et al. | |
| 6,288,366 B1 | 9/2001 | Dings | |
| 6,394,794 B2 | 5/2002 | Bloom et al. | |
| 6,421,931 B1 * | 7/2002 | Chapman | F26B 17/04 34/210 |
| 6,882,902 B2 | 4/2005 | Nobuhara et al. | |
| 7,170,036 B2 | 1/2007 | Richert et al. | |
| 7,514,650 B2 * | 4/2009 | Melgaard et al. | 219/388 |
| 7,805,064 B2 | 9/2010 | Ragay et al. | |
| 8,039,289 B2 | 10/2011 | Parks et al. | |
| 8,110,015 B2 | 2/2012 | Neiderman et al. | |
| 2003/0153252 A1 * | 8/2003 | Cron | 451/56 |
| 2005/0087183 A1 * | 4/2005 | Klobucar et al. | 126/21 A |
| 2005/0204582 A1 * | 9/2005 | Rossi et al. | 34/551 |
| 2006/0093392 A1 * | 5/2006 | Baker et al. | 399/93 |
| 2008/0314892 A1 | 12/2008 | Graham | |
| 2009/0133628 A1 | 5/2009 | Dahl et al. | |
| 2009/0145002 A1 * | 6/2009 | Brewer et al. | 34/443 |
| 2009/0223079 A1 | 9/2009 | Myong | |
| 2009/0260255 A1 * | 10/2009 | Baccini | 34/508 |
| 2009/0308860 A1 * | 12/2009 | Baccini | 219/618 |
| 2010/0220983 A1 | 9/2010 | Doherty et al. | |
| 2011/0013892 A1 | 1/2011 | Ragay et al. | |
| 2011/0306160 A1 | 12/2011 | Parks et al. | |

FOREIGN PATENT DOCUMENTS

| | | |
|---|---|---|
| GB | 153620 | 10/1920 |
| WO | 2009053785 | 4/2009 |

OTHER PUBLICATIONS

State Intellectual Property Office, P.R. China, "Notice of Allowance from CN Application No. 201280024616.1 mailed Nov. 2, 2015", Nov. 2, 2015, pp. 1-4, Published in: CN.

* cited by examiner

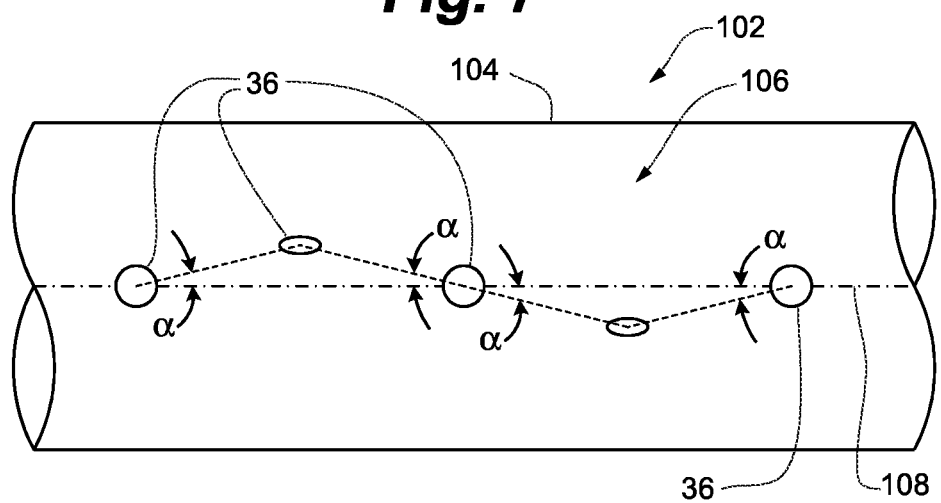
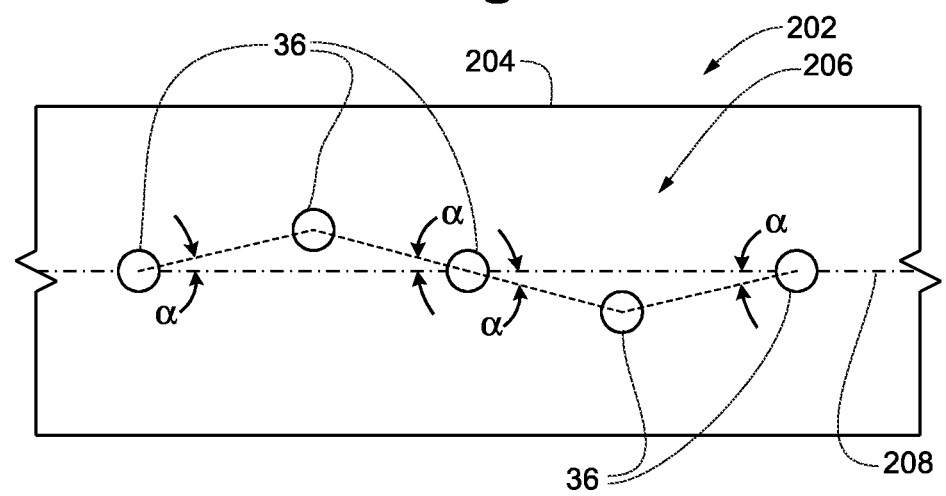

DRYER

CROSS-REFERENCE TO RELATED APPLICATIONS

This application claims the benefit of U.S. Provisional Patent Application Ser. No. 61/475,821 filed Apr. 15, 2011 which is hereby incorporated herein in its entirety by reference.

TECHNICAL FIELD

The present invention relates to a dryer. In particular, the invention pertains to a dryer for silicon wafers.

BACKGROUND

During production, many products are subjected to heat treatment for various reasons, including thermal curing during semiconductor wafer fabrication, annealing operations to harden a material of the product, such as steel, or the like. Often times, the heat treatment process is carried out at very high temperatures. Dryers comprising conveyors for drying components placed thereon are widely used in a variety of industries.

One such application includes dryers for fusing or drying a conductive metallization paste onto silicon wafers for photovoltaic cells. Such dryers typically transport the silicon wafers on a conveyor through an enclosure wherein infrared (IR) heaters and very small amount of process air, if any, is introduced and/or removed from the dryer enclosure. In some such dryers, some process air is introduced into the enclosure through the surrounding insulation or via sparge tubes. As volatile organic compounds (VOCs) are evaporated from the paste, a mixture of the fluid including air and the vaporized compounds from within the enclosure is extracted through exhaust ports at the entrance and/or exit of the enclosure. As such, the process air does not contribute to the drying process, but merely functions as an agent or a means for removing the vaporized compounds from within the enclosure.

Some dryers do not use IR heaters, but employ re-circulated forced air. However, the air is generally introduced into the enclosure at low velocities and is therefore not efficient at removing the vaporized compounds. Because re-circulated air is used, the concentration of the vaporized compounds eventually reaches a saturation point at which extraction of the vaporized compounds may not be possible. Furthermore, the vaporized compounds start condensing within the ductwork and other components of the system, requiring frequent shut-downs for maintenance.

SUMMARY

In an embodiment of a dryer, an enclosure having a first and a second opening includes a transporter for transporting one or more components through the enclosure between the first and the second opening. The dryer includes one or more heating elements in at least a portion of the enclosure proximate the first opening, and a first and a second duct within the enclosure. The first and said second duct each include a closed end, an inlet, and a plurality of openings configured for discharging air towards the one or more components. A first and a second heater respectively heat air supplied to the first and the second duct by a supply blower in fluid communication with the inlet of the first and the second duct. An exhaust stack in fluid communication with an interior of the enclosure includes an exhaust blower for extracting fluid from within the enclosure.

The plurality of openings, in some embodiments of the dryer, are configured for discharging air in at least partially overlapping patterns on a surface of the one or more components on the transporter. In certain embodiments of the dryer, the interior of the enclosure is maintained at a temperature at least equal to or greater than a saturation temperature of each one of one or more compounds on the one or more components on the transporter. The supply and the exhaust blowers, in some embodiments of the dryer, cooperatively operate to create a negative pressure within the enclosure for inducing infiltration of air through the first and the second opening.

A method of operating (or using) an embodiment of the dryer comprises transporting one or more components through the enclosure between the first and the second opening. One or more compounds on and/or within the one or more components is vaporized by the heating elements and/or by the heated air discharged from the plurality of openings in the first and the second duct towards the one or more components. Fluid from within the enclosure is extracted by the exhaust blower. In certain embodiments, the heating elements, and the supply and exhaust blowers are operated to maintain the interior of the enclosure at a temperature at least equal to or greater than the saturation temperature of each one of the one or more compounds on and/or within the one or more components on the transporter. The supply and the exhaust blowers, in some embodiments, are operated in a manner conducive for inducing infiltration of air through the first and the second opening by creating a negative pressure within the enclosure.

BRIEF DESCRIPTION OF THE DRAWINGS

FIG. 7 is a partial detailed view of a duct for supplying heated air through a plurality of openings in an embodiment of the dryer of FIG. 1; and FIG. 8 is another partial detailed view of a duct for supplying heated air through a plurality of openings in an embodiment of the dryer of FIG. 1.

DETAILED DESCRIPTION

Figure 1:
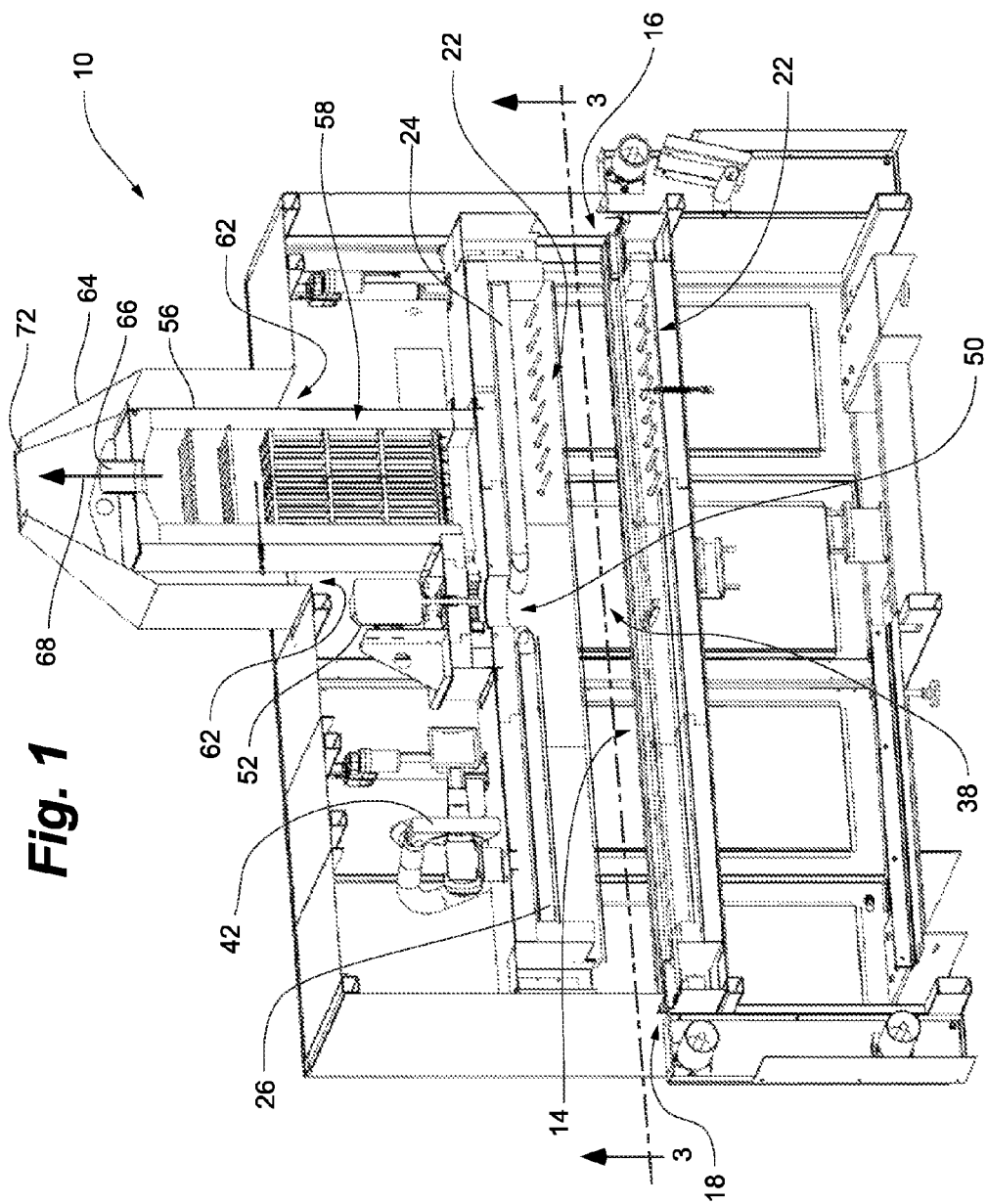
FIG. 1 is a cut-out along a longitudinal extent of a dryer in accordance with an embodiment of the invention.
Figure 2:
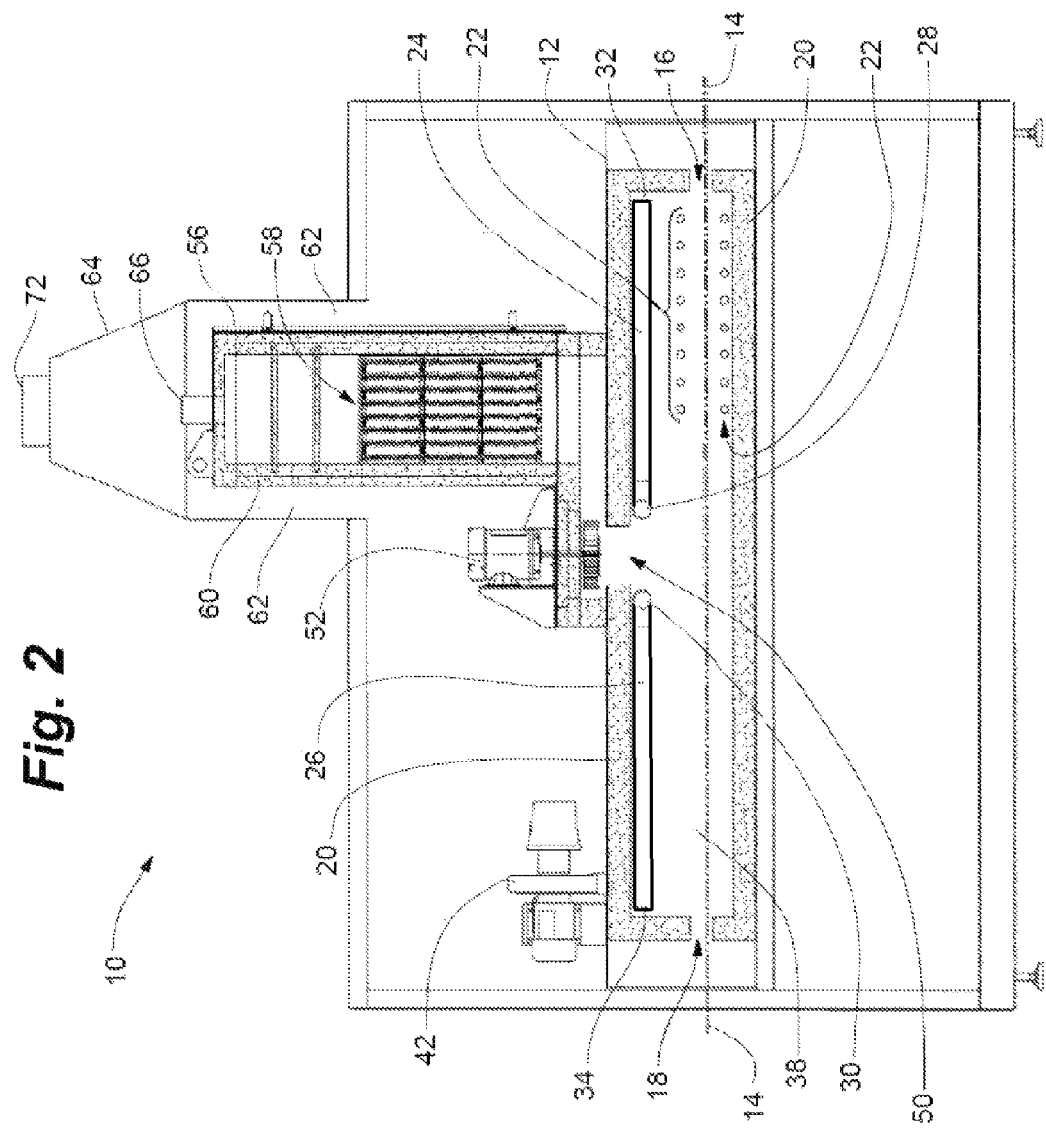
FIG. 2 is a side cross-sectional view as observed from an interior of the dryer of FIG. 1.

While multiple embodiments are disclosed herein, still others may become apparent to one skilled in the art. In the following, certain illustrative and non-limiting embodiments are described in detail with reference to the accompanying drawings wherein like elements are designated by like numerals. It should be clearly understood that there is no intent, implied or otherwise, to limit the invention in any form or manner to that described herein. As such, all alternative embodiments are considered as falling within the spirit, scope and intent of the disclosure. The metes and bounds of the invention are defined by the appended claims and any and all equivalents thereof.

As illustrated, an embodiment of dryer 10 comprises tunnel-like enclosure 12 having transporter 14 for transporting one or more components (not shown) through enclosure 12 along a path of travel extending between first and second opening 16 and 18, respectively. Embodiments of dryer 10 are described herein from a perspective wherein first opening 16 is an inlet (or entrance) and second opening 18 is an outlet (or exit) for the one or more components transported through enclosure 12. Although enclosure 12 is shown having a generally square cross-section along its longitudinal extent, in certain embodiments of dryer 10, enclosure 12 includes cross-sections that are, for example, rectangular, circular, triangular, etc. While enclosure 12 is illustrated having a generally uniform cross-section along its longitudinal extent, certain embodiments of dryer 10 comprising enclosure 12 having varying cross-sections and/or aspect ratios between first and second opening 16 and 18 are considered as being within the metes and bounds of the invention. For instance, the cross-section of enclosure 12, in some embodiments, includes one or more sections having one or more uniform cross-sections that are different from the cross-section of one or more other sections. In certain other embodiments of dryer 10, the cross-section of enclosure 10 varies continuously between first and second opening 16 and 18. In short, the dimensions or cross-sectional area of enclosure 12 can be uniform or varying along the path of travel between first and second openings 16 and 18. While enclosure 12 and transporter 14 are illustrated as being linear along their longitudinal extent, this does not always have to be the case. For instance, enclosure 12 and transporter 14, in some embodiments of dryer 10 have a curvilinear path between first and second opening 16 and 18. The illustrated embodiments of dryer 10 include optional thermal insulation 20 on at least a portion of an external surface of enclosure 12.

Some embodiments of dryer 10 include one or more heating elements 22 located within at least a portion of enclosure 12 proximate first opening 16. Generally, heating elements 22 are arranged and configured for heating the one or more components on transporter 14 while being transported through enclosure 12 between first and second opening 16 and 18. As such, depending on the arrangement of heating elements 22, heat directed towards the one or more components heats and vaporizes one or more compounds within and/or on a surface (e.g., a top and/or a bottom surface) of the one or more components, e.g., vaporizing a conductive metallic paste on a silicon wafer such as solar cell for example.

In some embodiments, heating elements 22 are infra-red (IR) heaters; however alternate forms of heating (e.g., direct fire burners, etc.) are considered as being within the metes and bounds of the invention. While heating elements 22 are illustrated as being located both over and under transporter 14, this does not always have to be the case. For instance, in some embodiments of dryer 10, heating elements 22 are placed either over or under transporter 14. Embodiments of dryer 10 comprising heating elements 22 arranged in a manner different from those depicted in the figures are considered as being within the metes and bounds of the invention. For instance, some embodiments of dryer 10 include heating elements 22 over and/or under the entire extent of transporter 14 between first and second opening 16 and 18. In certain embodiments of dryer 10, heating elements 22 are placed within a section of enclosure 12 that is not proximate first and/or second opening 16 and/or 18. Heating elements 22, in some embodiments of dryer 10, are placed at an angle (e.g., 45°, 90°, etc.) relative to the one or more components on transporter 14. In some embodiments of dryer 10, heating elements 22 circumscribe transporter 14 within enclosure 12. Additional and alternate arrangements and configurations for heating the one or more components and vaporizing the one or more compounds that may become apparent to one skilled in the art are considered as being within the metes and bounds of the invention.

In addition to heating elements 22, or in the alternative, embodiments of dryer 10 comprise first and second duct 24 and 26 within enclosure 12. As illustrated, first and second duct 24 and 26 each respectively include inlet 28 and 30 and closed end 32 and 34. As described herein below with reference to FIGS. 7 and 8, first and second duct 24 and 26, in some embodiments, include a plurality of openings 36 (illustrated as holes) on at least a portion between their respective inlets 28 and 30 and their respective closed ends 32 and 34. Openings 36 can be holes or slits arranged and configured for discharging air supplied to first and second duct 24 and 26 into interior 38 of enclosure 12.

Figure 3:
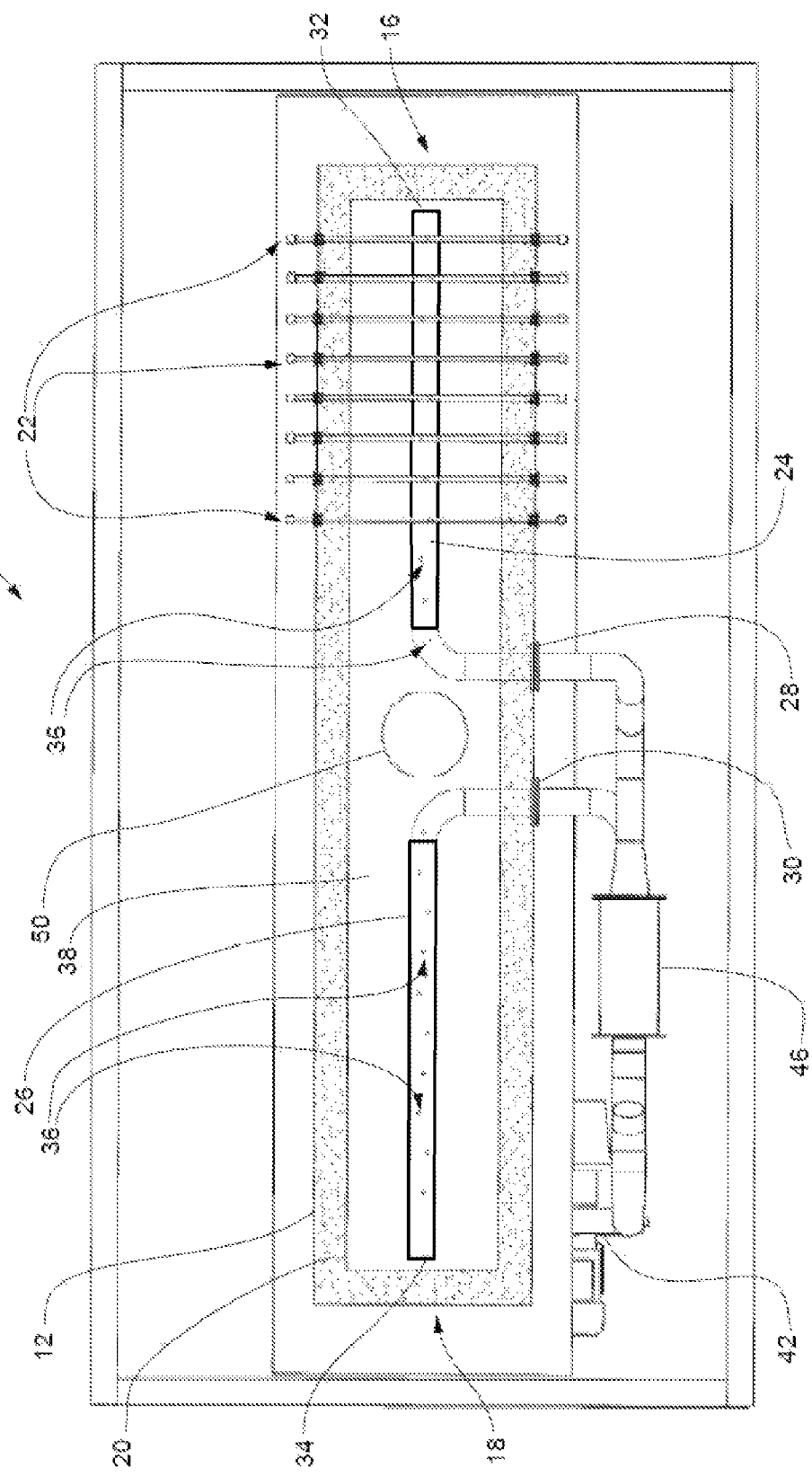
FIG. 3 is a bottom cross-sectional view along line 3-3 from an interior of the dryer of FIG. 1.
Figure 4:
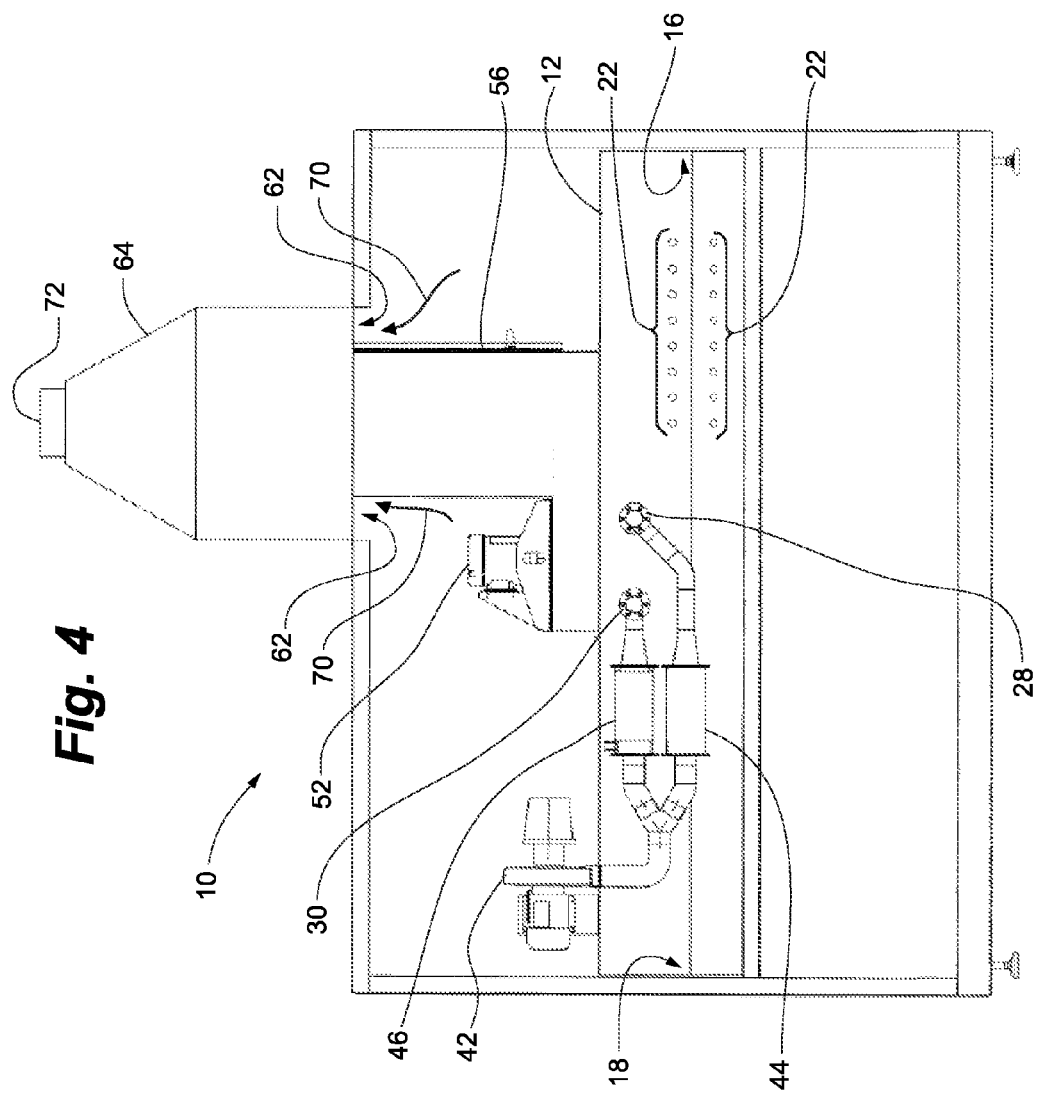
FIG. 4 is a side view of the dryer of FIG. 1.
Figure 5:
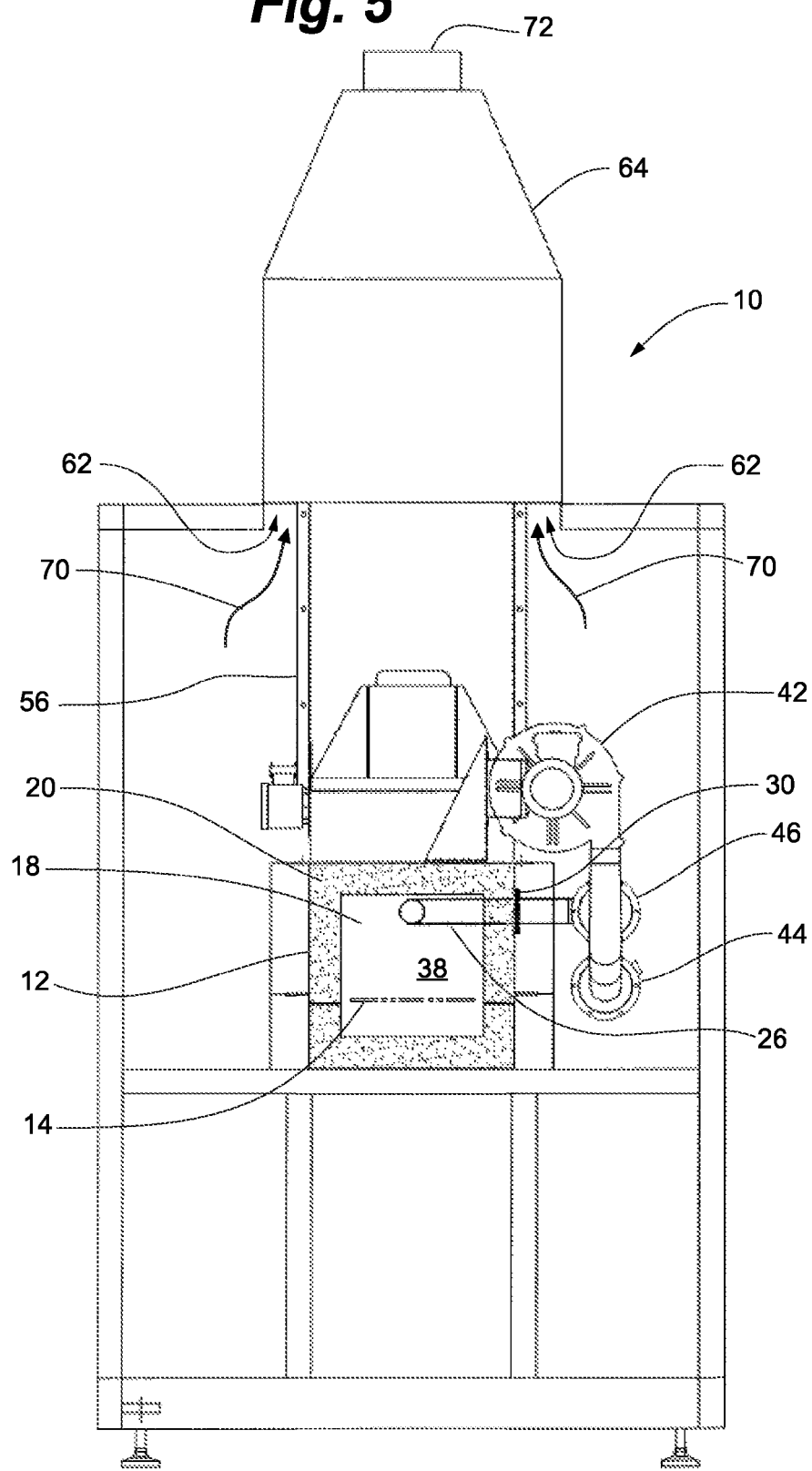
FIG. 5 is an end view of the dryer of FIG. 1.

Generally, air discharged from openings 36 is directed towards the one or more components on transporter 14 such that at least a portion of the discharged air is directed towards the one or more components or forms at least partially overlapping flow patterns in the immediate vicinity of the one or more components. As illustrated in FIG. 3, first and second duct 24 and 26, in some embodiments of dryer 10, are placed over (or above) an approximate center of transporter 14 and traverse a longitudinal extent thereof. Also as illustrated in FIG. 3, openings 36, in certain embodiments of dryer 10, are oriented facing transporter 14. As such, FIG. 3 illustrates an embodiment wherein the discharged air is directed towards and/or onto the top surface of the one or more components being transported by transporter 14 through enclosure 12 between first and second openings 16 and 18.

Figure 6:
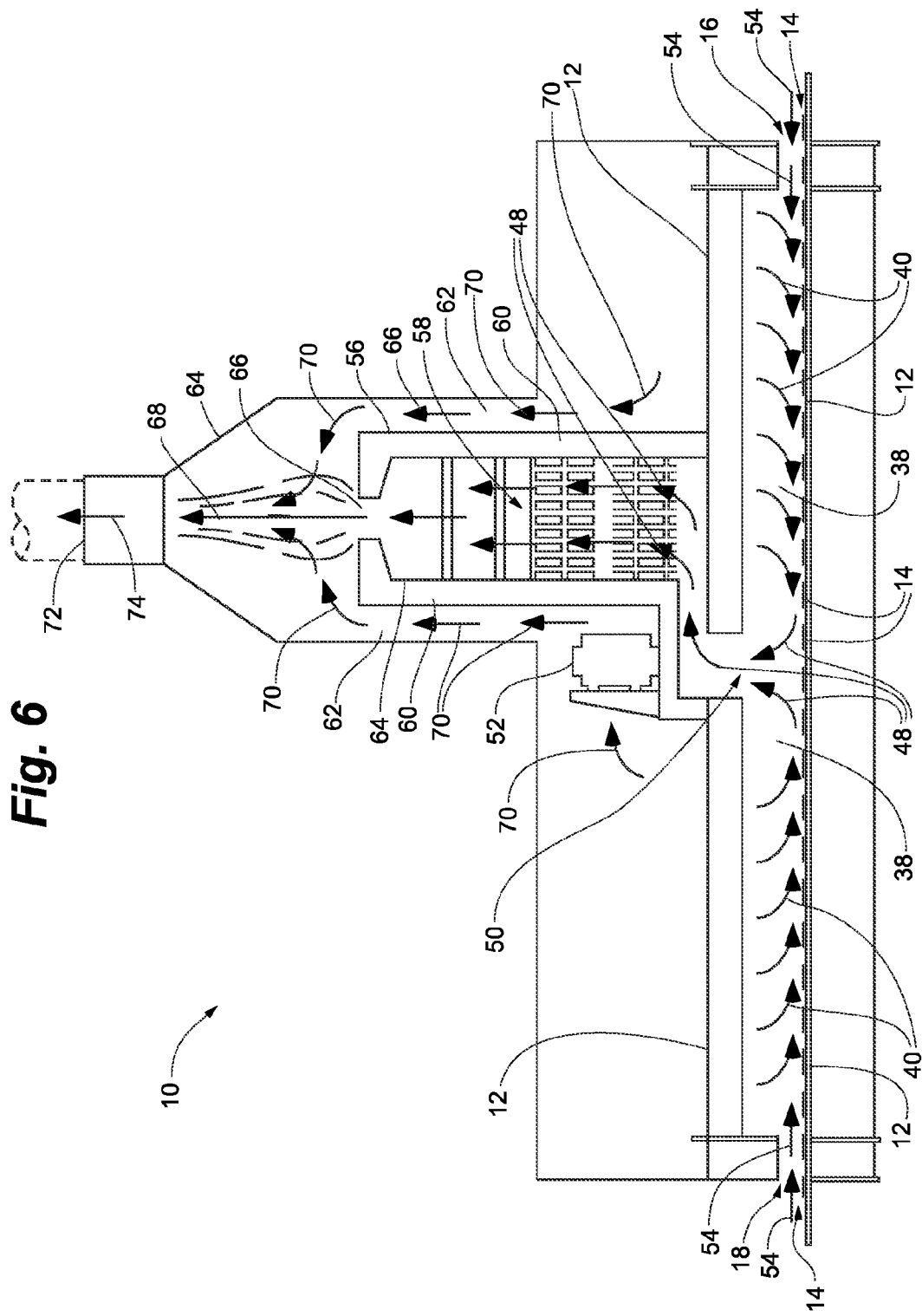
FIG. 6 illustrates fluid flow paths within the dryer of FIG. 1.

As illustrated in FIG. 6, the air discharged into interior 38 generally flows along flow paths 40. However, such arrangements and configurations are not always necessary. For instance, in some embodiments of dryer 10, the discharged air is directed towards the one or more components from under transporter 14. In certain other embodiments of dryer 10, the discharged air is directed along a flow path in the same plane as and/or along a plane parallel to the one or more components. In some embodiments of dryer 10, the discharged air is directed towards the one or more components at an angle relative thereto. In yet other embodiments of dryer 10, one or more additional ducts may be provided within enclosure 12. Other designs suitable for providing the described functionality may become apparent to one skilled in the art. All additional and alternate arrangements and configurations are considered as being within the metes and bounds of the invention.

In some embodiments of dryer 10, inlets 28 and 30 are positioned proximate a center of enclosure 12, and first and second duct 24 and 26 within enclosure 12 extend therefrom with respective closed ends 32 and 34 terminating within enclosure 12 proximate first and second opening 16 and 18, respectively. In certain embodiments of dryer 10, inlets 28 and 30 are positioned proximate first and second opening 16 and 18, respectively, and first and second duct 24 and 26 within enclosure 12 extend therefrom with respective closed ends 32 and 34 terminating within enclosure 12 proximate a center thereof. First and second duct 24 and 26, in some embodiments of dryer 10, include a unitary (one-piece) common inlet and not separate inlets 28 and 30. Some embodiments of dryer 10 include one of first and second ducts 24 and 26, but not both, in other words include a single duct. For instance, certain embodiments of dryer 10 comprise one or more continuous or contiguous ducts extending approximately the entire extent within enclosure 12 between first and second opening 16 and 18 wherein each duct includes an inlet proximate one of the openings and a closed end proximate the other opening. Dryer 10, in certain embodiments, comprises one or more ducts within a section of enclosure 12 wherein an inlet and a closed end of each duct is at one or more locations other than first and second opening 16 and 18 and/or the center of enclosure 12. One or more ducts, in some embodiments of dryer 10, are on an external surface of enclosure 12 with the air discharged from openings 36 entering interior 38 through a plurality of openings, e.g., holes, slits, etc., in the external surface of enclosure 12. Alternate or additional duct configurations, as may become apparent to one skilled in the art, are considered as being within the metes and bounds of the invention.

In some embodiments of dryer 10, one or both first and second duct 24 and 26 are round ducts having a circular cross-section. The one or more ducts, in certain embodiments of dryer 10, can have one or more cross-sections that are oval (or elliptical), square, rectangular, triangular, combinations of different geometries, etc. While first and second duct 24 and 26 are depicted as having a generally uniform cross-section along their longitudinal extent, this is not always necessary. For instance, in some embodiments of dryer 10, the one or more ducts discharging air into interior 38 of enclosure 12 include one or more sections wherein the cross-section of the one or more sections are uniform or non-uniform or some combination thereof, e.g., some sections having a first cross-section and other sections including a second cross-section different from the first cross-section. The one or more ducts, in certain embodiments of dryer 10, include continuously varying cross-sections along their longitudinal extent.

In addition to the foregoing, or in the alternative, one or both first and second duct 22 and 24 include one or more flow control systems, e.g., dampers, for manipulating the flow of air therethrough and/or for manipulating the flow of air discharged through openings 36. Other configurations for discharging air into interior 38 and/or towards the one or more components on transporter 14 may become apparent to one skilled in the art. All additional and alternate arrangements and configurations are considered as being within the metes and bounds of the invention.

In some embodiments of dryer 10, air is supplied by supply blower 42 and at least a portion of the air from supply blower 42 is first heated by first and second heaters 44 and 46 before entering fluidly connected first and second duct 24 and 26, respectively, through their respective inlets 28 and 30. While dryer 10 is depicted comprising one supply blower 42 supplying air to both first and second duct 24 and 26, it should be apparent that certain embodiments of dryer 10 comprise one or more supply blowers 42 in separate and individual fluid connectivity with one or more inlets of each of first and second duct 24 and 26. In such embodiments, first and second heater 44 and 46 respectively heat the air supplied to first and second duct 24 and 26. Also, while dryer 10 is depicted as comprising first and second heater 44 and 46 for heating the air supplied to respective first and second duct 24 and 26, it should be apparent that some embodiments of dryer 10 comprise one heater for heating the air exiting supply blower 42 prior to its division into two flow paths, each delivering the heated air to first and second duct 24 and 26. The heated air supplied to first and second duct 24 and 26, in certain embodiments of dryer 10, is heated by a plurality of heaters. Additional and alternate arrangements and configurations for heating the air supplied to the one or more ducts that may become apparent to one skilled in the art are considered as being within the metes and bounds of the invention.

As previously described, the one or more components on transporter 14 may include one or more compounds therewithin and/or on a surface (e.g., a top and/or a bottom surface) thereof. In some embodiments of dryer 10, heat from heating elements 22 and/or the heated air discharged from openings 36 is used for vaporizing the one or more compounds as the one or more components are transported through enclosure 12. The vaporized compounds, having diffused into interior 38 of enclosure 12, are extracted therefrom along flow path 48 through extraction port 50 of enclosure 12 by fluidly communicative exhaust blower 52.

While extraction port 50 is illustrated on a top surface of dryer 10 at a location approximately equidistant from first and second opening 16 and 18, it should be apparent that one or more alternate or additional configurations are possible. For instance, extraction port 50 in some embodiments of dryer 10 is located on one or both side surfaces and/or on the bottom surface of enclosure 12 in addition to or in the alternative to being located on the top surface. Additionally, or alternatively, extraction port 50 is located anywhere along the extent of enclosure 12, including proximate first or second opening 16 or 18. Some embodiments of dryer 10 comprise more than one extraction port 50 for extracting the fluid from interior 38 at one or more locations along the extent of enclosure 12. Extraction port 50, in certain embodiments of dryer 10, circumscribes enclosure 12. In certain embodiments of dryer 10, extraction port 50 includes one or more flow control systems, e.g., dampers. Also, certain embodiments of dryer 10 comprise more than one exhaust blower 52. Additional and alternate arrangements and configurations, as may become apparent to one skilled in the art, are considered as being within the metes and bounds of the invention.

In certain embodiments of dryer 10, supply blower 42 and exhaust blower 52 are operated in a manner such that at least a portion of interior 38 of enclosure 12 is maintained at a pressure at least partially less than the surrounding atmospheric pressure. The pressure differential induces air from an environment external to dryer 10 and/or external to enclosure 12 to infiltrate along flow paths 54 into interior 38 through first and second opening 16 and 18. In some embodiments of dryer 10, such infiltration of air at least minimizes, and in some embodiments inhibits, exfiltration of the one or more vaporized compounds from enclosure 12. For at least minimizing, and in some embodiments inhibiting, condensation of the vaporized compounds, and for facilitating uninterrupted vaporization of the one or more compounds, interior 38 is maintained at a temperature at least equal to or greater than the saturation temperature of each one of the one or more compounds. Fluid, including a mixture of air and the vaporized compounds, extracted from enclosure 12 by exhaust blower 52 is directed along flow path 48 through exhaust stack 56.

Exhaust stack 56, in some embodiments of dryer 10, includes one or more heating elements 58 therewithin and thermal insulation 60. Flow passage 62 around an external surface of exhaust stack 56 is defined at least partially by housing 64 surrounding in a spaced relationship to at least a portion of exhaust stack 56. Heating elements 58 can heat the fluid extracted from interior 38 to a temperature at least equal to or greater than the oxidation temperature of each one of the one or more vaporized compounds. The flow of the heated fluid exiting exhaust stack 56 at exit 66 along flow path 68 induces air from an environment external to dryer 10 and/or external to enclosure 12 to infiltrate along flow path 70 into flow passage 62. The mixture of the heated fluid exiting exhaust stack 56 and the infiltrated air along flow path 70 in flow passage 62 exit dryer 10 at port 72 along flow path 74.

FIGS. 7 and 8 respectively illustrate partial detailed views of round duct 102 and rectangular (or square) duct 202. In the following, and unless indicated otherwise, round duct 102 and rectangular duct 202 will be combinatorially referred to as "one or more ducts" or simply "duct(s)" when describing similar features and components therebetween. The one or more ducts, i.e., round duct 102 and rectangular duct 202, are illustrated as including openings 36 extending through respective walls 104/204 for providing fluid communication between an interior and an exterior of the ducts. Air from one or more supply blowers, e.g., supply blower 42, enters each duct through an inlet thereof, e.g., inlet 28/30, and discharge through openings 36 into interior 38 of enclosure 12. Prior to entering the ducts, the air can be heated by one or more heaters, e.g., first and second heaters 44 and 46. As previously described with reference to FIG. 3, the ducts, in some embodiments of dryer 10, are placed over (or above) an approximate center of transporter 14 and traverse a longitudinal extent thereof. Also as previously described with reference to FIG. 3, openings 36, in certain embodiments of dryer 10, are oriented towards (or facing) transporter 14 such that the air discharged from openings 36 is directed towards the one or more components on transporter 14.

In some embodiments, openings 36 of the one or more ducts are generally circular or round shaped holes formed in serpentine pattern 106/206 about line 108/208 such that each opening 36 has an angular off-set of α degrees from each one of its two most adjacent openings 36. In embodiments of dryer 10 comprising one or more round ducts 102, openings 36 are round holes having a circular cross-section.

While openings 36 have been described in the foregoing as being generally round or circular in shape, this does not always have to be the case. For instance, in some embodiments, openings 36 of the ducts (i.e., ducts 24, 26, 102, 202, etc.), are rectangular, triangular, square, oval, elliptical, slits, etc. In certain embodiments, openings 36 are a combination of different shapes. Also, while all openings 36 have been illustrated and described as having generally similar dimensions, some embodiments of dryer 10 include one or more ducts wherein some or all openings 36 have aspect ratios that are similar or different from one another. For instance, some embodiments of dryer 10 comprise ducts wherein the aspect ratios of openings 36 varies along the longitudinal extent of the ducts, e.g., the diameter of openings 36 proximate the inlet are smaller than the diameter of openings 36 proximate the closed end. In some embodiments, openings 36 are generally perpendicular to the inside and/or outside surface of the ducts. Openings 36, in certain embodiments, are not generally perpendicular to the inside and/or outside surface of the ducts. For instance, openings 36 are formed at one or more different angles relative to the inside and/or outside surface of the ducts.

While the one or more ducts illustrated in FIGS. 3, 7 and 8 show only one opening 36 offset from lines 108/208 between two adjacent openings 36 along lines 108/208, this also does not always have to be the case. For instance, in some embodiments of dryer 10, the ducts have two or more openings 36 offset from lines 108/208 between two adjacent openings along lines 108/208. In certain embodiments of dryer 10, the one or more ducts include one or more opening patterns different from serpentine patterns 106/206 illustrated in FIGS. 3, 7 and 8. For instance, openings 36 in some of the ducts have a trapezoidal pattern.

In general, the one or more ducts and/or openings 36 are configured such that air is discharged towards or in the immediate vicinity of the one or more components. Openings 36 can be positioned such that the air is discharged in an at least partially overlapping pattern. As such, in some embodiments of dryer 10, the entire surface or major portions of the surface of the one or more components towards which the air is directed will experience at least a portion of the discharged air.

In some embodiments of dryer 10, adjacent openings 36 have an angular off-set in an approximate range of 0° to 30° relative to one another, i.e., 0° a 30°. The angular offset of an opening, in an exemplary embodiment of dryer 10, is approximately 20° relative to each one of its two most adjacent openings 36, i.e., α=20°. Openings 36, in certain embodiments of dryer 10, have a diameter of approximately 0.285 inches. The center-to-center (or on-center) distance between openings 36, in some embodiments of dryer 10, is approximately in the range of 0.0 to 6.0 inches. In an exemplary embodiment of dryer 10, the on-center distance is approximately 3.0 inches.

In addition to the foregoing, or in the alternative, embodiments of dryer 10 include one or more of a controller, a plurality of sensors, systems and means for operating dryer 10 including protocols for controlling the operating parameters of transporter 14, heating elements 22, one or both fans 42 and 52, one or both heaters 44 and 46, flow control systems, etc. Such operating parameters as are generally regulated by the controller include one or more of the on and/or off status, one or more speeds of transporter 14 and fans 42 and 52, a capacity of one or more of heating elements 22 and heaters 44 and 46, flow control dampers, etc. In some embodiments of dryer 10, the controller regulates the "on"/"off" status of heating elements 22 and/or one or both heaters 44 and 46. Certain embodiments of dryer 10 include one or more silicon controlled rectifiers (SCRs) in operational communication with the controller. The plurality of sensors include one or more of temperature sensors, chemical compound sensors such as sensors for volatile organic compounds (VOCs), one or more pressure sensors, one or more flow sensors, etc., in operational communication with the controller. As such, the controller can regulate the operation of dryer 10 by maintaining the operating conditions at pre-determined levels. The controller, in some embodiments of dryer 10 is a proportional controller or an integral controller or a derivative controller or any combination thereof.

In operation, one or more components, for example silicon wafers (such as solar cells) having metallization paste thereon, are placed on the top surface of transporter 14 at first opening 16 and transported through enclosure 12. Heating elements 22, for example infra-red heaters, located both over and under transporter 14 heat the one or more components as they travel through enclosure 12. Concurrently with or alternatively to heating elements 22, heated air enters ducts 24 and 26, discharges or exits through openings 36 into interior 38 and heats the one or more components. Upon heating the one or more components, some chemicals, for example VOCs, are evaporatively released from the metallization paste as the paste dries on the components. A mixture of the vaporized compounds, the heated air discharged through openings 36, and the air infiltrating through first and second opening 16 and 18 is extracted from interior 38 through extraction port 50. The mixture extracted from interior 38 is heated by heating elements 58 within exhaust stack 56 to a temperature at least equal to or greater than the oxidation temperature of each one of the one or more vaporized compounds. The controller, in an embodiment of dryer 10, regulates the operation and process of drying the one or more components by maintaining the operating conditions at pre-determined levels.

In view of the foregoing description of the various embodiments of dryer 10, other designs, arrangements, configurations, additions, modifications, etc. may become apparent to one skilled in the art. For example, while the described embodiments refer to particular features and/or functions, the invention is considered to also include embodiments having combinations of features and/or functions different from those described. All additional and alternate embodiments are considered as being within the metes and bounds of the invention as defined by the appended claims and any and all variants and equivalents thereof.

We claim:

1. A method of drying, comprising
transporting one or more components between a first and a second opening of an enclosure;
heating said one or more components with one or more heating elements in at least a portion of said enclosure proximate said first opening;
discharging heated air on towards a surface of said one or more components through a plurality of openings in a first and a second duct within said enclosure, said first and said second duct each comprising an inlet for said heated air and a closed end, at least a portion of each of said first and second ducts traversing a respective different longitudinal extent of said transporter;
vaporizing each of one or more compounds from said one or more components; and
extracting fluid from said enclosure into an exhaust stack.

2. The method of claim 1, including discharging said heated air from adjacent openings of said plurality of openings in at least partially overlapping patterns on a top surface of said one or more components on said transporter.

3. The method of claim 1, including maintaining said interior of said enclosure at a temperature at least equal to or greater than a saturation temperature of each one of said one or more vaporized compounds.

4. The method of claim 1, including maintaining a negative pressure within an interior of said enclosure for inducing infiltration of air through said first and said second opening.

5. The method of claim 1, including oxidizing each one of said one or more vaporized compounds in said extracted fluid.

6. The method of claim 1, including inducing a flow of air along an exterior of one or both of said enclosure and said exhaust stack.

7. A dryer, comprising
an enclosure comprising a first and a second opening;
a transporter for transporting one or more components through said enclosure between said first and said second opening;
one or more heating elements in at least a portion of said enclosure proximate said first opening;
a first and a second duct within said enclosure, said first and said second duct each comprising a closed end and an inlet, at least a portion of each of said first and second ducts traversing a respective different longitudinal extent of said transporter;
a plurality of openings in each of said first and said second duct, said plurality of openings configured for discharging air towards a surface of said one or more components;
a supply blower in fluid communication with said inlet of said first and said second duct;
a first and a second heater for respectively heating air supplied by said supply blower to said first and said second duct; and
an exhaust stack in fluid communication with an interior of said enclosure, said exhaust stack comprising an exhaust blower for extracting fluid from said enclosure.

8. The dryer of claim 7, wherein said plurality of openings are configured for discharging air from adjacent openings in at least partially overlapping patterns on a surface of said one or more components on said transporter.

9. The dryer of claim 8, wherein (a) said one or more heating elements, (b) said supply blower, (c) said first and said second heater, and (d) said exhaust blower cooperatively operate to maintain said interior of said enclosure at a temperature at least equal to or greater than a saturation temperature of each one of said one or more compounds.

10. The dryer of claim 9, comprising a third heater for heating said extracted fluid to a temperature at least equal to or greater than an oxidation temperature of each one of said one or more compounds.

11. The dryer of claim 10, comprising a housing surrounding said exhaust stack and at least partially defining a passage there between, wherein
a flow of said extracted fluid induces a flow of air through said passage from around an exterior of said enclosure; and
a flow of discharged air comprises a mixture of said extracted fluid and said air through said passage.

12. The dryer of claim 9, wherein said supply and said exhaust blower cooperatively operate to create a negative pressure within said enclosure for inducing infiltration of air through said first and said second opening.

13. The dryer of claim 9, wherein at least one of said one or more heating elements is over said transporter and configured for heating said one or more components from above.

14. The dryer of claim 9, wherein at least one of said one or more heating elements is underneath said transporter and configured for heating said one or more components from below.

15. The dryer of claim 8, wherein said first and said second duct extend longitudinally along an approximate center of said transporter.

16. The dryer of claim 8, wherein said plurality of openings are in a serpentine pattern.

17. The dryer of claim 7, wherein said closed end of each of said first and said second duct is respectively proximate said first and said second opening.

18. The dryer of claim 7, wherein said inlet of each of said first and said second duct is at a respective location proximate a center of the enclosure.

19. The dryer of claim 7, wherein said extracted fluid is extracted from a location approximately equidistant from said first and said second opening.

20. The dryer of claim 7, comprising one or more sensors in operational communication with a controller, said controller configured for regulating one or more of a pressure within said enclosure;
a temperature within said enclosure;
an operation of said supply blower;

a flow rate of air supplied to said first and said second duct;
a flow rate of air discharged from said plurality of openings;
an operation of said first and said second heater;
a temperature of said air supplied to said first and said second duct;
a temperature of air discharged from said plurality of openings;
an operation of said exhaust blower;
a flow rate of said extracted fluid;
a temperature of said extracted fluid exiting said exhaust stack;
a concentration level of each of said one or more compounds;
said one or more heating elements; and
a speed of said transporter.

\* \* \* \* \*